(12) United States Patent
Oh et al.

(10) Patent No.: US 11,929,239 B2
(45) Date of Patent: Mar. 12, 2024

(54) PLASMA PROCESSING APPARATUS AND SEMICONDUCTOR DEVICE MANUFACTURING METHOD USING THE SAME

(71) Applicant: Samsung Electronics Co., Ltd., Suwon-si (KR)

(72) Inventors: Sejin Oh, Hwaseong-si (KR); Iksu Byun, Seoul (KR); Taemin Earmme, Hwaseong-si (KR); Jongwoo Sun, Hwaseong-si (KR); Jewoo Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/466,184

(22) Filed: Sep. 3, 2021

(65) Prior Publication Data

US 2022/0223385 A1    Jul. 14, 2022

(30) Foreign Application Priority Data

Jan. 8, 2021    (KR) .......................... 10-2021-0002674

(51) Int. Cl.
| | |
|---|---|
| *H01J 37/32* | (2006.01) |
| *H01L 21/311* | (2006.01) |
| *H01L 21/683* | (2006.01) |
| *H01L 21/687* | (2006.01) |

(52) U.S. Cl.
CPC .. *H01J 37/32642* (2013.01); *H01J 37/32174* (2013.01); *H01J 37/3255* (2013.01); *H01J 37/32568* (2013.01); *H01J 37/32715* (2013.01); *H01L 21/31116* (2013.01); *H01L 21/6833* (2013.01); *H01L 21/68735* (2013.01); *H01J 2237/334* (2013.01)

(58) Field of Classification Search
CPC .......... H01J 37/32642; H01J 37/32174; H01J 37/6833; H01J 37/68735
See application file for complete search history.

(56) References Cited

U.S. PATENT DOCUMENTS

| | | | |
|---|---|---|---|
| 7,758,764 B2 | 7/2010 | Dhindsa et al. | |
| 8,486,798 B1* | 7/2013 | Chen ................. | H01J 37/32623 156/345.43 |
| 9,852,889 B1 | 12/2017 | Kellogg et al. | |
| 10,685,862 B2 | 6/2020 | Rogers | |
| 2004/0074605 A1* | 4/2004 | Nezu ................. | H01J 37/32623 156/345.47 |

(Continued)

*Primary Examiner* — Keath T Chen
(74) *Attorney, Agent, or Firm* — Muir Patent Law, PLLC

(57) ABSTRACT

A plasma processing apparatus includes: an electrostatic chuck supporting a wafer, and connected to a first power supply, an edge ring disposed to surround an edge of the electrostatic chuck and formed of a material having a first resistivity value, a dielectric ring supporting a lower portion of the edge ring, formed of a material having a second resistivity value lower than that of the first resistivity value, and connected to a second power supply, and an electrode ring disposed in a region overlapping the dielectric ring, in contact with a lower surface of the edge ring, and formed of a material having a third resistivity value greater than the first resistivity value, wherein the third resistivity value is a value of 90 Ωcm to 1000 Ωcm.

18 Claims, 11 Drawing Sheets

(56) References Cited

U.S. PATENT DOCUMENTS

| | | | |
|---|---|---|---|
| 2006/0170078 A1* | 8/2006 | Moriya | H01L 21/3225 257/E21.321 |
| 2008/0110860 A1* | 5/2008 | Miller | H01J 37/32623 216/67 |
| 2009/0071938 A1* | 3/2009 | Dhindsa | H01J 37/32091 156/345.48 |
| 2010/0203736 A1* | 8/2010 | Ichino | H01J 37/32183 257/E21.218 |
| 2011/0104884 A1* | 5/2011 | Koshiishi | H01J 37/20 156/345.43 |
| 2015/0179412 A1* | 6/2015 | Chhatre | H01J 37/32642 156/345.52 |
| 2017/0018411 A1 | 1/2017 | Sriraman et al. | |
| 2018/0130659 A1* | 5/2018 | Salimian | H01J 37/32706 |
| 2018/0151334 A1* | 5/2018 | Lin | H01L 21/67069 |
| 2018/0182647 A1* | 6/2018 | Noh | H01L 21/67069 |
| 2019/0013184 A1* | 1/2019 | Cui | H01J 37/32174 |
| 2019/0228952 A1 | 7/2019 | Dorf et al. | |
| 2019/0267217 A1* | 8/2019 | Nagaiwa | H01J 37/32715 |
| 2020/0219701 A1 | 7/2020 | Koshimizu | |
| 2020/0219706 A1 | 7/2020 | Koshimizu | |
| 2022/0254612 A1* | 8/2022 | Kimball | H01L 21/68735 |
| 2023/0092887 A1* | 3/2023 | Hopkins | H01J 37/32146 |

\* cited by examiner

PLASMA PROCESSING APPARATUS AND SEMICONDUCTOR DEVICE MANUFACTURING METHOD USING THE SAME

CROSS-REFERENCE TO RELATED APPLICATION(S)

This application claims benefit of priority to Korean Patent Application No. 10-2021-0002674 filed on Jan. 8, 2021 in the Korean Intellectual Property Office, the disclosure of which is incorporated herein by reference in its entirety.

BACKGROUND

1. Field

The present disclosure relates to a plasma processing apparatus and a method of manufacturing a semiconductor device using the same.

2. Description of Related Art

In general, semiconductor devices are manufactured through a plurality of unit processes including a thin film deposition process, a dry etching process, or a cleaning process, and the dry etching process is mainly performed in a semiconductor manufacturing apparatus in which a plasma reaction is induced. With miniaturization and high integration of semiconductor products, a non-uniform dry etching process is having increasing influence on characteristics of semiconductor devices.

SUMMARY

An aspect of the present inventive concept is to provide a plasma processing apparatus in which a control range of a plasma sheath formed above an edge ring disposed around a wafer is expanded, and perturbation of plasma is minimized in a process of controlling the plasma sheath through the edge ring.

An aspect of the present inventive concept is to provide a method of manufacturing semiconductor devices in which a control range of the plasma sheath formed above the edge ring disposed around the wafer is expanded, and perturbation of the plasma by the plasma sheath control of the edge ring is minimized.

According to an aspect of the present inventive concept, a plasma processing apparatus includes: an electrostatic chuck supporting a wafer, and connected to a first power supply, an edge ring disposed to surround an edge of the electrostatic chuck and formed of a material having a first resistivity value, a dielectric ring supporting a lower portion of the edge ring, formed of a material having a second resistivity value lower than that of the first resistivity value, and connected to a second power supply, and an electrode ring disposed in a region overlapping the dielectric ring, in contact with a lower surface of the edge ring, and formed of a material having a third resistivity value greater than the first resistivity value, wherein the third resistivity value is a value of 90 Ωcm to 1000 Ωcm.

According to an aspect of the present inventive concept, a plasma processing apparatus includes: a processing chamber, an upper electrode disposed in an upper region of the processing chamber and connected to a first power supply, a lower electrode disposed below the upper electrode, supporting a wafer, and connected to a second power supply, an edge ring disposed to surround an edge of the lower electrode and formed of a first semiconductor material having a first resistivity value, a dielectric ring supporting a lower portion of the edge ring, formed of a material having a second resistivity value lower than that of the first resistivity value, and connected to a third power supply, and an electrode ring disposed in a region overlapping the dielectric ring, in contact with a lower surface of the edge ring, and formed of a second semiconductor material having a third resistivity value greater than the first resistivity value.

According to an aspect of the present inventive concept, a method of manufacturing a semiconductor device, the method includes: loading a wafer on a lower electrode of a plasma processing apparatus including a processing chamber, an upper electrode disposed above the processing chamber, a lower electrode disposed below the upper electrode and supporting the wafer, an edge ring disposed to surround an edge of the lower electrode and formed of a first semiconductor material having a first resistivity value, a dielectric ring supporting a lower portion of the edge ring, formed of a material having a second resistivity value lower than that of the first resistivity value, and connected to a third power supply, and an electrode ring disposed in a region overlapping the dielectric ring, in contact with a lower surface of the edge ring, and formed of a second semiconductor material having a third resistivity value greater than the first resistivity value, forming plasma in the processing chamber by applying first power supply and second power supply to the upper electrode and the lower electrode, respectively, and controlling a potential of a plasma sheath formed above the edge ring by applying third power supply to the dielectric ring, and adjusting a voltage of the third power supply.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, a plasma processing apparatus according to example embodiments of the present inventive concept will be described with reference to the accompanying drawings.

Figure 1:
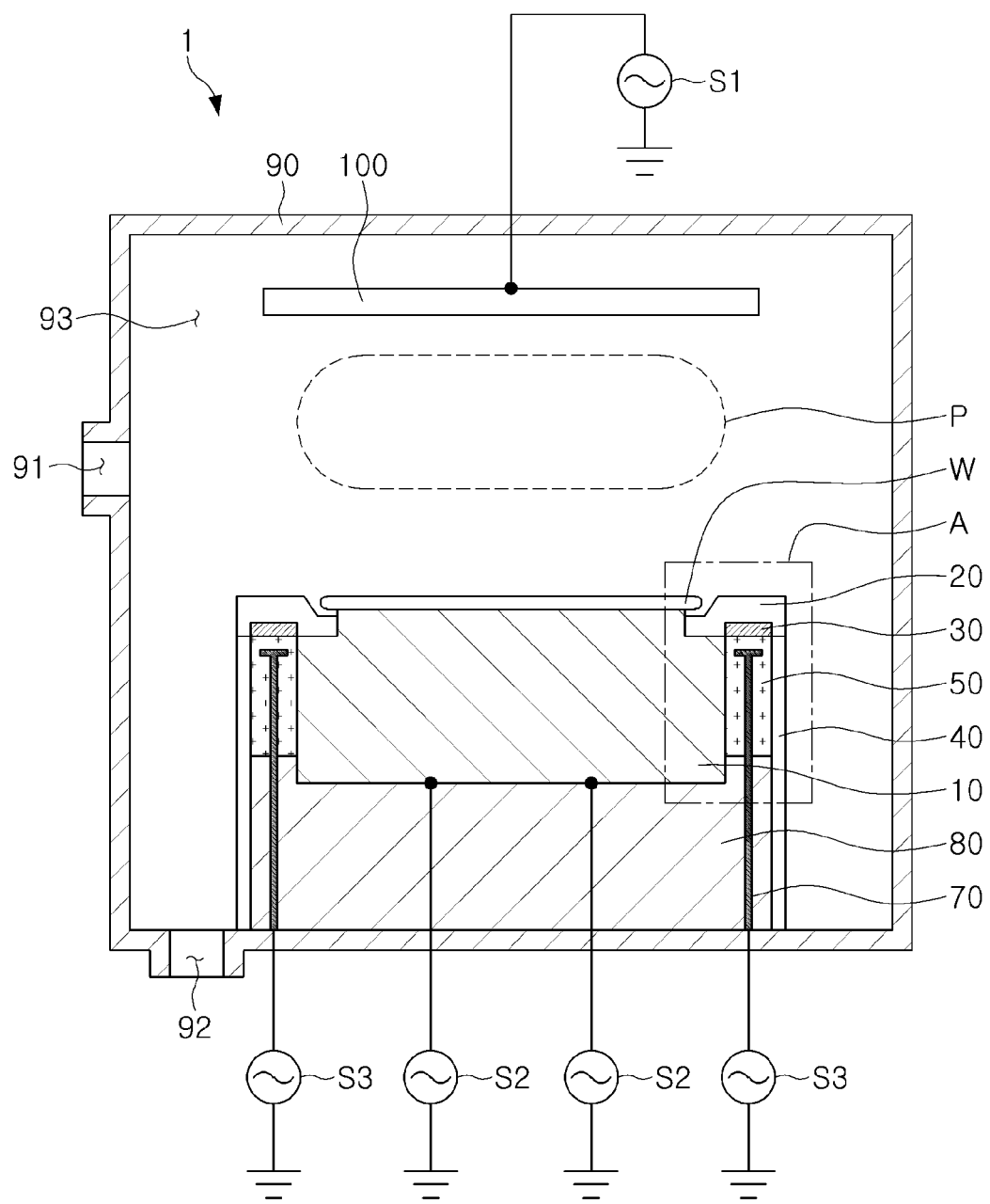
FIG. 1 is a diagram schematically illustrating a plasma processing apparatus according to an example embodiment of the present inventive concept.

A plasma processing apparatus according to an example embodiment will be described with reference to FIGS. 1 and 2. FIG. 1 is a view schematically illustrating a plasma processing apparatus according to an example embodiment of the present inventive concept, and FIG. 2 is an enlarged view of area "A" of FIG. 1 according to example embodiments.

Figure 2:
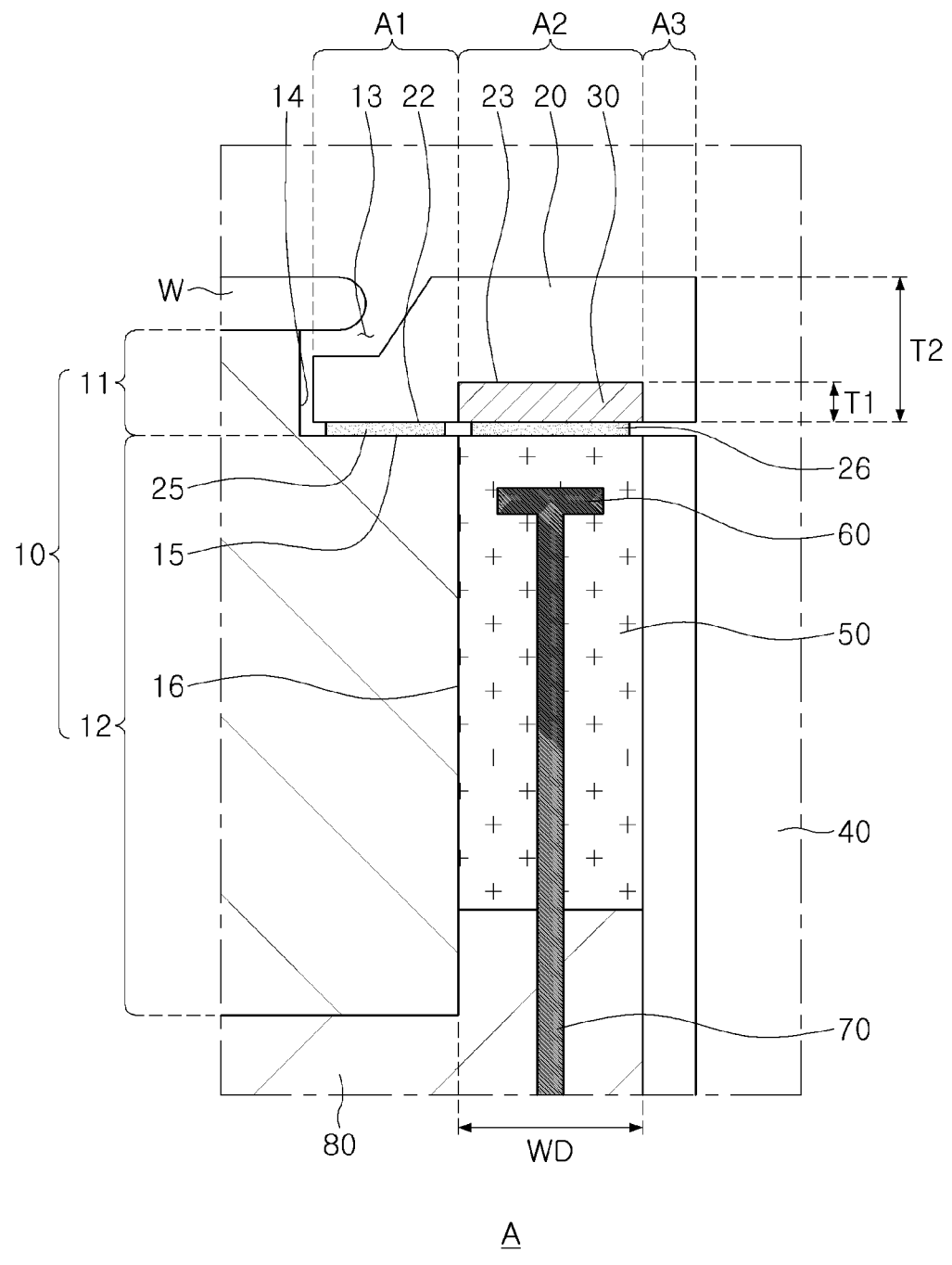
FIG. 2 is an enlarged view of area "A" of FIG. 1 according to example embodiments.

Referring to FIGS. 1 and 2, a plasma processing apparatus 1 according to an example embodiment of the present inventive concept may include a processing chamber 90, a lower electrode 10 disposed in the processing chamber 90 and supporting a wafer W, an upper electrode 100 disposed above the lower electrode 10, an edge ring 20 surrounding the lower electrode 10, a dielectric ring 50 disposed on a lower surface of the edge ring 20, and an electrode ring 30 disposed below the edge ring 20. In addition, the plasma processing apparatus 1 may further include an insulation ring 80 disposed below the lower electrode 10, and a ground ring 40 surrounding an outer circumferential surface of the dielectric ring 50 and the insulation ring 80. In an example embodiment, the electrode ring 30 may not overlap the ground ring 40.

The processing chamber 90 has an internal space 93, and plasma P may be formed in the internal space 93 to perform a plasma treatment process for a wafer W, for example, a dry etching process for the wafer W may be formed. The processing chamber 90 may include an inlet 91 and an outlet 92 that can be selectively opened and closed according to controlling thereof. Source gas used in the plasma treatment process may be supplied into the processing chamber 90 through the inlet 91. By-products generated by the plasma treatment process may be discharged through the outlet 92. In FIG. 1, it is illustrated that one inlet 91 and one outlet 92 are formed in the processing chamber 90, but the present inventive concept is not limited thereto. The processing chamber 90 may also include a plurality of inlets 91 and a plurality of outlets 92, respectively.

A lower electrode 10 may be disposed in the internal space 93 of the processing chamber 90, and an upper electrode 100 may be disposed above the lower electrode 10 to face the lower electrode 10.

The lower electrode 10 may be connected to a second radio frequency (RF) power supply unit S2 to apply RF power. Depending on an example embodiment, a plurality of second RF power supply units S2 may be disposed. The upper electrode 100 may be connected to a first RF power supply unit S1 to receive RF power, and may be synchronized with the lower electrode 10 to excite the source gas supplied into the processing chamber 90 with plasma P.

The dielectric ring 50 may be connected to a third RF power supply unit S3 to receive RF power, and may control an electric field formed on the edge ring 20 disposed above the dielectric ring 50. The edge ring 20 may improve continuity of a plasma sheath formed above an edge of the wafer W. Accordingly, for example, ion tilting and ion focusing to the edge of the wafer W can be reduced. This will be described in detail later.

The lower electrode 10 may support an object to be processed, that is, the wafer W. For example, the lower electrode 10 may be an electrostatic chuck. That is, the wafer W may be seated on the lower electrode 10 by electrostatic force formed above the lower electrode 10.

The lower electrode 10 may have a shape similar to that of the wafer W, and for example, an upper surface of the lower electrode 10 may be formed in a circular shape. The lower electrode 10 may include an upper portion 11 facing the wafer W and a lower portion 12 facing the insulation ring 80. Diameters of the upper portion 11 and the lower portion 12 of the lower electrode 10 may be different from each other, for example, the diameter of the lower portion 12 of the lower electrode 10 may be greater than the diameter of the upper portion 11 of the lower electrode 10. In this case, the lower electrode 10 may have a stepped portion 13 formed of an outer circumferential surface 14 of the upper portion 11 and an upper surface 15 of the lower portion 12 at an edge thereof. However, the present inventive concept is not limited thereto, and the diameter of the upper portion 11 and the diameter of the lower portion 12 of the lower electrode 10 may be the same.

The dielectric ring 50 may have an upper surface extending from a bottom surface of the stepped portion 13. The edge ring 20 may be disposed to overlap the bottom surface of the stepped portion 13 and the upper surface of the dielectric ring 50.

In example embodiments, the wafer W may completely cover the upper portion 11 of the lower electrode 10, and a portion of the wafer W may protrude in a radial direction of the lower electrode 10 than the edge of the upper portion 11 of the lower electrode 10. For example, the diameter of the upper portion 11 of the lower electrode 10 may be smaller than the diameter of the wafer W. This is to prevent damage to the lower electrode 10 in a plasma processing process for the wafer W, for example, in a dry etching process, and the upper surface of the wafer W may be exposed to the plasma P, but the upper portion 11 of the lower electrode 10 may not be directly exposed to the plasma P.

Referring to FIGS. 1 and 2, the dielectric ring 50 may have a ring shape surrounding the lower portion 12 of the lower electrode 10. For example, the dielectric ring 50 may be disposed to be in contact with an outer peripheral surface 16 of the lower portion 12 and to surround the same. The dielectric ring 50 may be disposed under the edge ring 20 to support the edge ring 20. The dielectric ring 50 may include a metallic material having a lower resistivity value than the edge ring 20. More specifically, the dielectric ring 50 may include $Al_2O_3$, but the present inventive concept is not limited thereto. An electrode pad 60 may be buried in the dielectric ring 50, and the electrode pad 60 may be connected to a third RF power supply unit S3 through an electrode pin 70. The electrode pad 60 and the electrode pin 70 may be formed of a material having high conductivity. The third RF power supply unit S3 may apply a low-frequency RF voltage having a lower frequency than that of each of the first and second RF power supply units S1 and S2, such as 400 KHz and 2 MHz to 13.56 MHz. Accordingly, the low-frequency RF voltage supplied from the third RF power supply unit S3 through the dielectric ring 50 may be applied to the edge ring 20.

Figure 3:
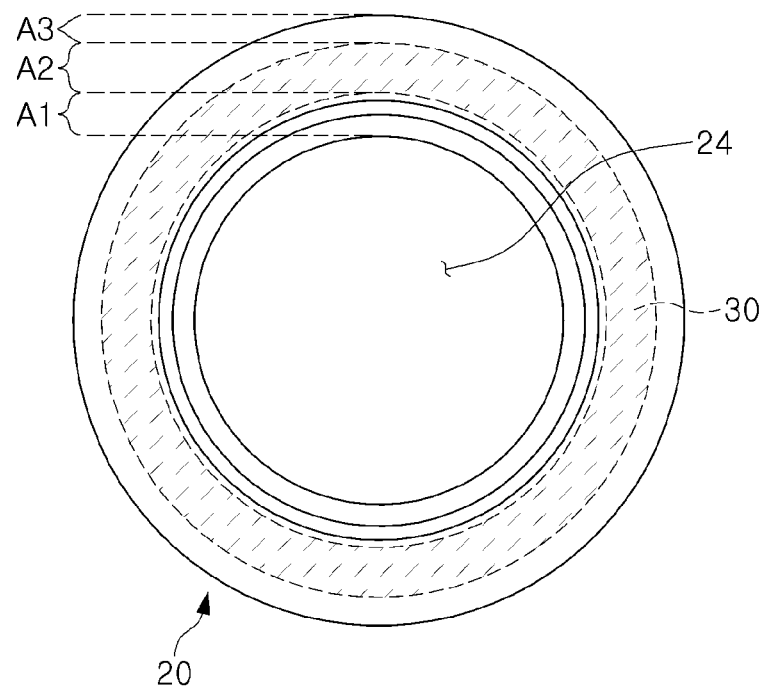
FIG. 3 is a plan view of the edge ring of FIG. 1 according to example embodiments.

FIG. 3 is a plan view of the edge ring of FIG. 1 according to example embodiments.

Referring to FIGS. 2 and 3, an edge ring 20 may be disposed to surround an edge of the wafer W. The edge ring 20 may surround a portion of the lower electrode 10 on which the wafer W is disposed. For example, the edge ring 20 may be disposed to surround the upper portion 11 of the lower electrode 10. The edge ring 20 may have a ring shape in which a hole 24 is formed in a center thereof. For example, the edge ring 20 may be formed to have a thickness T2 of 4 mm to 30 mm.

The edge ring 20 may have first to third regions A1 to A3 along a circumferential direction.

A first region A1 is disposed below the edge of the wafer W, and may be defined as a region surrounding an outer circumferential surface 14 of the upper portion 11 of the lower electrode 10. The first region A1 may be disposed to cover a portion of an upper surface 15 of the lower portion 12 of the lower electrode 10. Thereby, the edge ring 20 may prevent the lower electrode 10 from being damaged during the plasma treatment process. A second region A2 is a region in which the electrode ring 30 is disposed, and may be defined as a region overlapping the dielectric ring 50. A third region A3 may be defined as a region overlapping the ground ring 40.

The edge ring 20 may serve to expand the surface of the wafer W during a plasma processing process for processing the wafer W. During the plasma processing process, a phenomenon in which plasma P is concentrated on the edge of the wafer W, that is, on the outer circumferential surface, may occur. For this reason, dry etching may not be performed evenly on the surface of the wafer W, and a degree of etching may be uneven. The edge ring 20 may be disposed so as to surround the outer circumferential surface of the wafer W, so that a surface region of the wafer W may be expanded. As a result, a phenomenon in which the plasma P is concentrated on the outer circumferential surface of the wafer W can be alleviated.

In example embodiments, the edge ring 20 may be formed of a material having a resistivity value of 1 Ωcm to 10 Ωcm. For example, the edge ring 20 may be formed of a semiconductor material such as silicon (Si), silicon carbide (SiC), and gallium arsenide (GaAs). Accordingly, the edge ring 20 may have electrode properties when power is applied thereto.

When an electric field is formed by applying RF power to the lower electrode 10 and/or the upper electrode 100, the edge ring 20 may expand a region in which the electric field is formed so that the entire wafer W is uniformly processed. In addition, the edge ring 20 may function to control a plasma sheath formed above the edge ring 20, by controlling an electric field formed by RF power supplied through the dielectric ring 50. However, when an electric field is formed in the edge ring 20 to control the plasma sheath formed above the edge ring 20, an overall distribution of the plasma P may be perturbed. In the plasma processing apparatus 1 of an example embodiment, an electrode ring 30 having high resistivity on the lower surface of the edge ring 20 may be disposed to minimize an effect of the electric field formed by the edge ring 20. Accordingly, in the plasma processing apparatus 1 according to an example embodiment, perturbation of the plasma P due to the electric field of the edge ring 20 may be minimized, and a range in which the plasma sheath is controlled may be increased. A detailed description thereof will be described later.

Referring to FIG. 2, an electrode ring 30 may be disposed in a region of a lower surface 22 of the edge ring 20 overlapping the dielectric ring 50. A width of the electrode ring 30 may be the same as a width WD of the dielectric ring 50. However, the width of the electrode ring 30 does not have to be exactly the same as the width WD of the dielectric ring 50, and it is sufficient that the width of the electrode ring 30 is 90% or more of the width WD of the dielectric ring 50.

The electrode ring 30 may be attached to the lower surface 22 of the edge ring 20, or may be disposed in a groove 23 formed on the lower surface 22 of the edge ring 20. For example, the edge ring 20 has the groove 23 disposed along a circumferential direction on the lower surface 22 of the edge ring 20.

In an example embodiment, the electrode ring 30 may be formed of a material having a higher resistivity value than that of the edge ring 20. For example, the electrode ring 30 may be formed of a material having a resistivity value of 90 Ωcm to 1000 Ωcm. In an example embodiment, the electrode ring 30 may be formed of a semiconductor material such as silicon (Si), silicon carbide (SiC), gallium arsenide (GaAs), and the like. In an example embodiment, if the electrode ring 30 is formed of the same material as the edge ring 20, the electrode ring 30 may have a lower dopant concentration than the edge ring 20 so as to have a higher resistivity value than the edge ring 20. For example, when the electrode ring 30 is formed of silicon (Si), the dopant may be As, P, B, Al, or the like. In addition, when the electrode ring 30 is formed of silicon carbide (SiC), the dopant may be N, P, B, or the like. In an example embodiment, the electrode ring 30 may be formed by coating the lower surface 22 of the edge ring 20. In an example embodiment, the electrode ring 30 may be manufactured in a form of a bulk ring, and may also be attached to the lower surface 22 of the edge ring 20. The electrode ring 30 may have a thickness T1, smaller than that of the edge ring 20. For example, the electrode ring 30 may be formed to have a thickness T1 of 2 mm to 30 mm.

Figure 7:
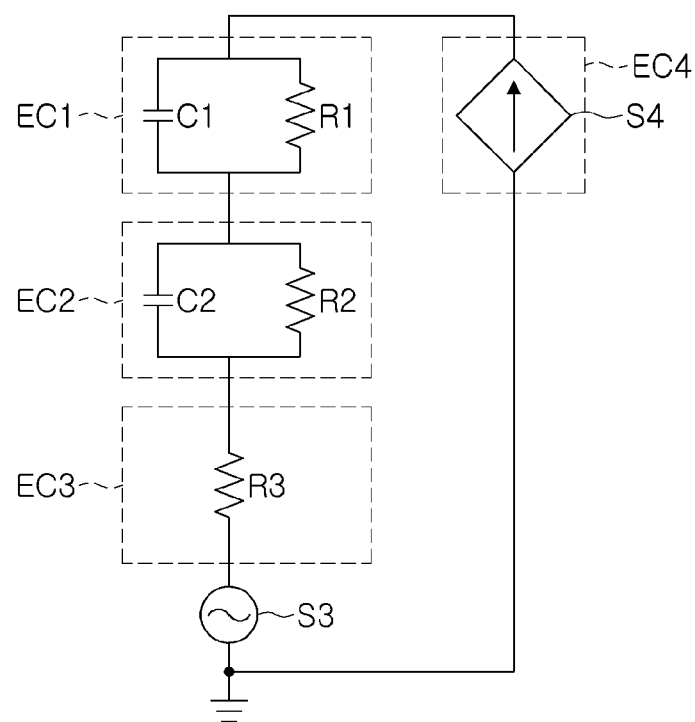
FIG. 7 is an equivalent circuit of the plasma processing apparatus of FIG. 1 according to example embodiments.
Figure 8:
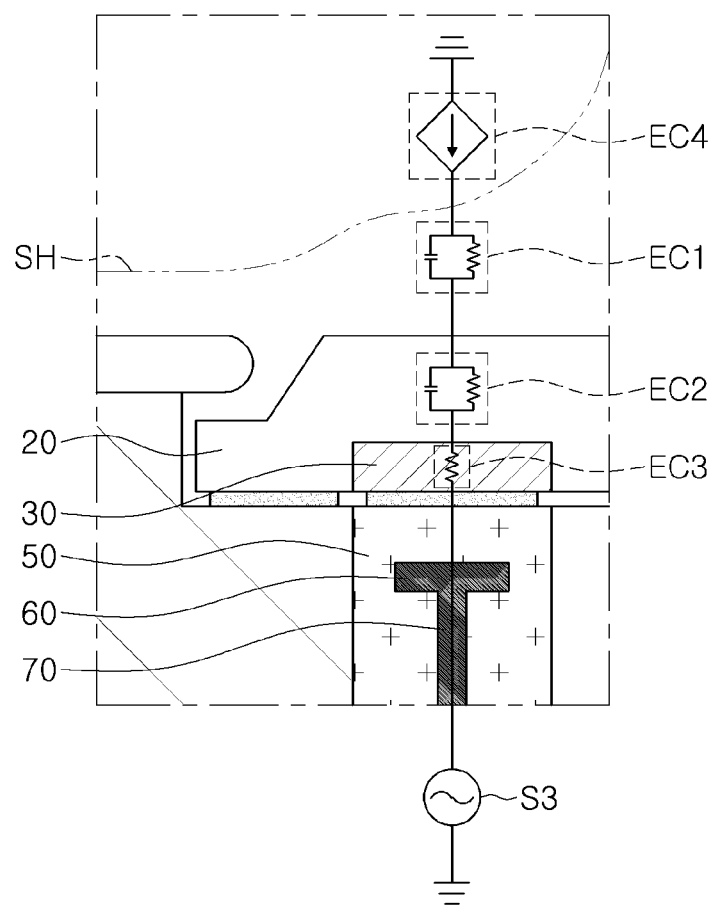
FIG. 8 is a view illustrating the equivalent circuit of FIG. 7 superimposed on FIG. 2 according to example embodiments.
Figure 9:
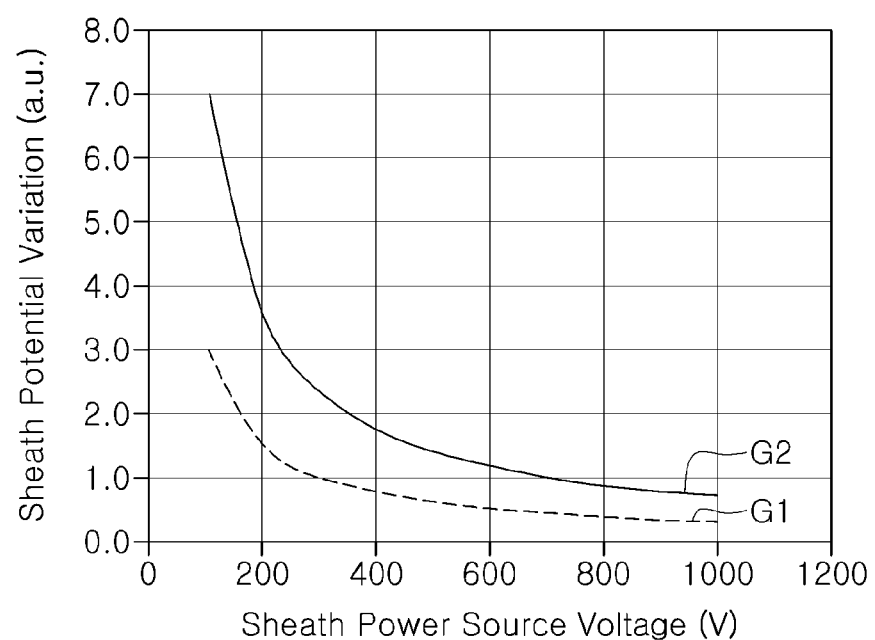
FIG. 9 is a graph illustrating an improvement effect of an example embodiment of the present inventive concept.
Figure 10A:
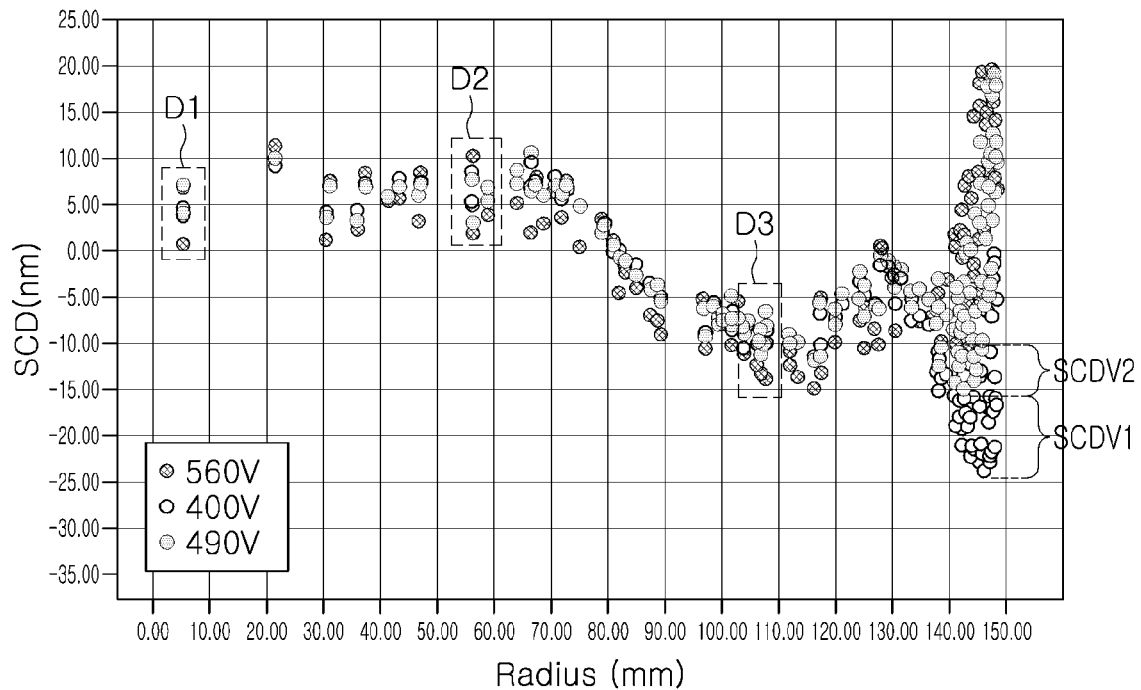
FIGS. 10A and 10B are views illustrating experimental results for an Example and a Comparative example.
Figure 10B:
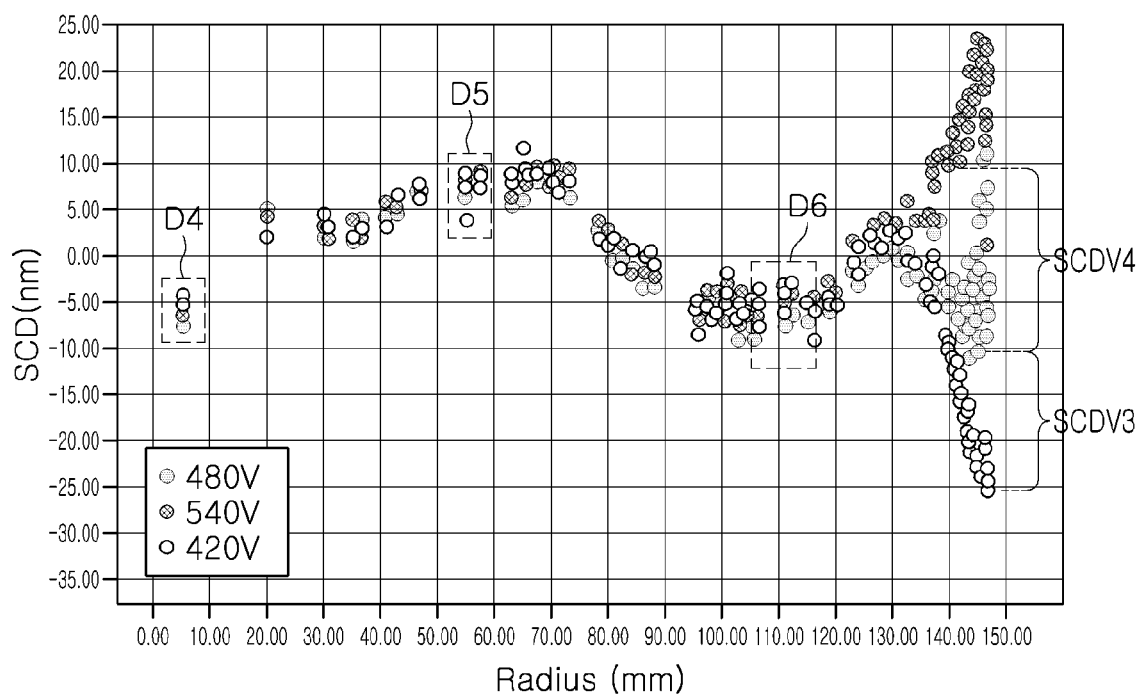

An effect of improving a control range of a plasma sheath formed above the edge ring 20 by the electrode ring 30 will be described with reference to FIGS. 7 to 9, 10A and 10B. FIG. 7 is an equivalent circuit of the plasma processing apparatus of FIG. 1, and FIG. 8 is a view illustrating the equivalent circuit of FIG. 7 superimposed on FIG. 2. FIG. 9 is a graph showing an improvement effect of an example embodiment of the present inventive concept, and FIGS. 10A and 10B are views illustrating experimental results for an Example and a Comparative example of the present inventive concept.

In order to calculate power consumed in a peripheral region of the edge ring 20, as shown in FIGS. 7 and 8, the peripheral region of the edge ring 20 may be modeled as an equivalent circuit. A first equivalent circuit EC1 is an equivalent circuit for modeling power consumed by a plasma sheath SH, and may be configured by a parallel connection of a first capacitor C1 and a first resistor R1. A second equivalent circuit EC2 is an equivalent circuit for modeling power consumed by the edge ring 20 and may be configured by a parallel connection of a second capacitor C2 and a second resistor R2. A third equivalent circuit EC3 is an equivalent circuit for modeling power consumed by the electrode ring 30 and may be formed of a third resistor R3 having a higher resistivity value than the second resistor R2. The third equivalent circuit EC3 is modeled by connecting a third RF power supply unit S3 in series to apply a low-frequency RF voltage of 400 KHz. A plasma P formed above the edge ring 20 formed at this time may be modeled as a dependent current source S4 of a fourth equivalent circuit EC4 determined by the third RF power supply unit S3.

Accordingly, in an example embodiment, as compared to the Comparative example in which the electrode ring 30 is not disposed, a third equivalent circuit EC3 including a third resistor R3 may be further disposed. Since the third resistor R3 of the third equivalent circuit EC3 has a high resistivity value of 90 Ωcm to 1000 Ωcm, a current flowing through the equivalent circuit is reduced. Accordingly, power consumed by the first equivalent circuit EC1 may be reduced, such that unit power consumed to change a potential of a plasma sheath SH may be reduced. In addition, as the power consumed by the plasma sheath SH decreases, perturbation of the plasma P in a region, other than an upper portion of the edge ring 20 may be reduced.

FIG. 9 is a graph that illustrates a simulation of a plasma sheath control effect of an example embodiment, and it can be seen that a control range of the plasma sheath is increased by about 2.3 times in the Example (G2) compared to the Comparative example (G1). Thus, in an example embodiment, unit power consumed to change a potential of the plasma sheath may be reduced such that perturbation of the plasma P in a region, other than an upper portion of the edge ring 20 may be reduced. In the graph of FIG. 9, a horizontal axis represents an applied voltage V and a vertical axis represents a sheath potential variation per unit power in an arbitrary unit a.u. For example, the applied voltages 0V to 1200V may be applied to the edge ring 20 by the third RF power supply unit S3 through the dielectric ring 50.

FIGS. 10A and 10B are graphs comparing an amount of change in a skew critical dimension (SCD) according to the applied voltage as an experimental result of a Comparative example and an Example.

FIG. 10A shows an experiment result of a Comparative example in which only the edge ring 20 is disposed without the electrode ring 30, and the resistivity value of the edge ring 20 is 1 Ωcm to 10 Ωcm. In the case of the Comparative example, as a voltage applied to an edge region of a wafer (a 150 mm radius region) increases by 90V from 400V to 490V, it can be seen that a SCD increases by a first increase amount (SCDV1). In addition, as the voltage applied to the edge region of the wafer increases by 70V from 490V to 560V, it can be seen that the SCD increases by a second increase amount SCDV2.

FIG. 10B shows an experiment result of an example embodiment in which an electrode ring 30 is disposed below an edge ring 20, which is a case in which a resistivity value of the edge ring 20 is 1 Ωcm to 10 Ωcm, and the resistivity value of the electrode ring 30 is 400 Ωcm. In an example embodiment, as the voltage applied to the edge region of the wafer and applied to the edge ring 20 increases by 60V from 420V to 480V, it can be seen that the SCD increases by a third increase amount SCDV3. In addition, as the voltage applied to the edge region of the wafer increases by 60V from 480V to 540V, it can be seen that the SCD increases by a fourth increase amount SCDV4. It can be seen that the third and fourth increments (SCDV3 and SCDV4) of an example embodiment are significantly improved, as compared to the first and second increments (SCDV1 and SCDV2) of the Comparative example, respectively. Accordingly, it can be seen that the control range of the plasma sheath according to the applied voltage is increased in the Example, as compared to the Comparative example. For example, the voltages 420V, 480V, and 540V of the Example may be applied to the edge ring 20 by the third RF power supply unit S3 through the dielectric ring 50.

In addition, when comparing the regions D1 to D3 of the Comparative example with the regions D4 to D6 of the Example, in an example embodiment, in an entire region (radius 0 mm to 140 mm) other than the edge region of the wafer, it can be seen that an amount of change in the SCD according to the change in the applied voltage is reduced. This means that even if the input voltage changes, fluctuation of the plasma P is small. Accordingly, it can be seen that, compared to the Comparative example, the perturbation of the plasma P in a region, other than the edge region of the wafer, that is, the region other than the upper portion of the edge ring 20, is reduced compared to the Comparative example.

Figure 4:
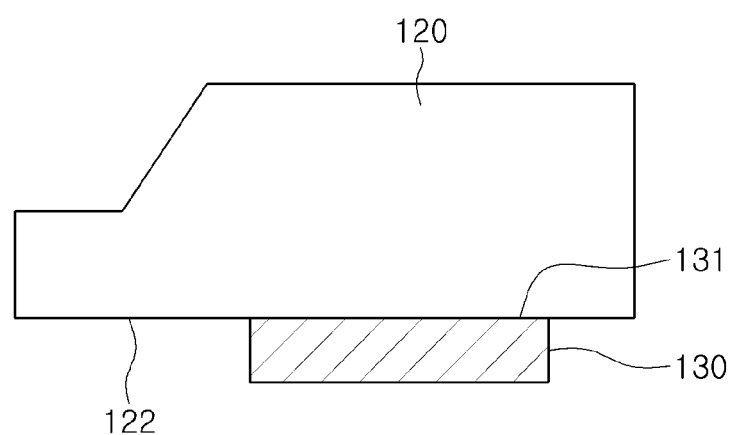
FIGS. 4 to 6 are views illustrating various electrode rings applicable to the plasma processing apparatus of FIG. 1 according to example embodiments.

Various modified examples of an electrode ring will be described with reference to FIGS. 4 to 6. Referring to FIG. 4, an electrode ring 130 may be disposed such that an upper surface 131 thereof abuts a flat lower surface 122 of an edge ring 120. For example, the upper surface 131 of the electrode ring 130 may contact the flat lower surface 122 of the edge ring 120.

Figure 5:
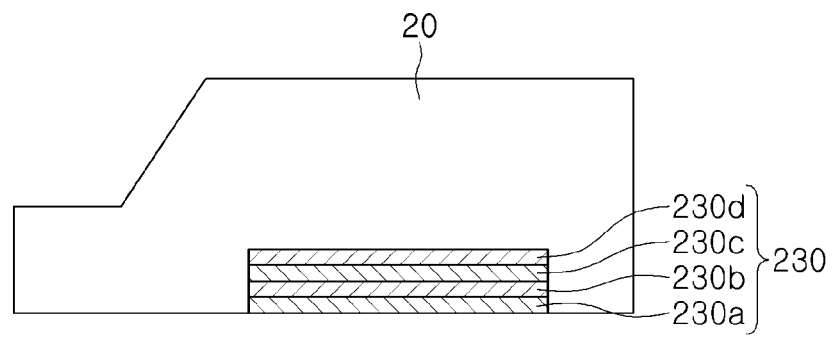

Referring to FIG. 5, an electrode ring 230 may have a form in which a plurality of layers 230a to 230d are stacked. The plurality of layers 230a to 230d may be disposed so that a resistivity value gradually increases toward an upper portion thereof. In an example embodiment, the plurality of layers 230a to 230d may be formed of the same material, and each of the layers may have only different concentrations of dopants. In this case, the concentration of the dopant of the plurality of layers 230a to 230d may decrease toward an upper region so that the resistivity value increases toward the upper region.

In an example embodiment, the plurality of layers 230a to 230d may be formed of different materials having different resistivity values, respectively. In this case, a layer disposed thereabove may be formed of a material having a relatively higher resistivity value, and a layer disposed therebelow may be formed of a material having a relatively lower resistivity value so as to increase the resistivity value toward the upper region.

Figure 6:
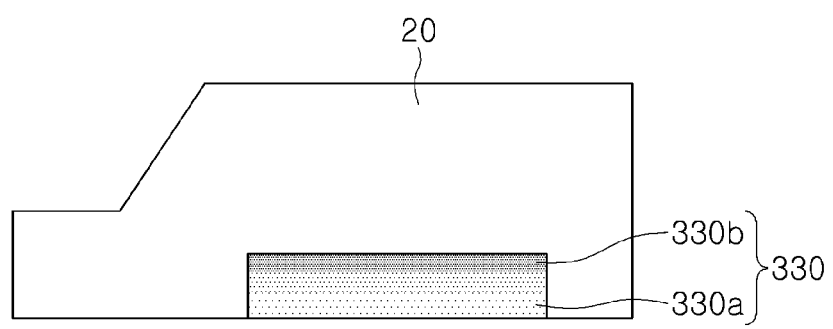

Referring to FIG. 6, an electrode ring 330 is formed of a single layer, but a dopant concentration in a lower region 330a may be disposed higher than a dopant concentration in an upper region 330b, such that it may be formed that the resistivity value increases toward the upper portion thereof.

Referring back to FIGS. 1 and 2, first and second pads 25 and 26 may be disposed on the lower surface 22 of the edge ring 20. The first pad 25 may be disposed between the edge ring 20 and the lower electrode 10. The second pad 26 may be disposed between the electrode ring 30 and the dielectric ring 50. The first and second pads 25 and 26 may include a material having good thermal conductivity, and for example, the first and second pads 25 and 26 may include a silicone-based adhesive material.

Figure 14:
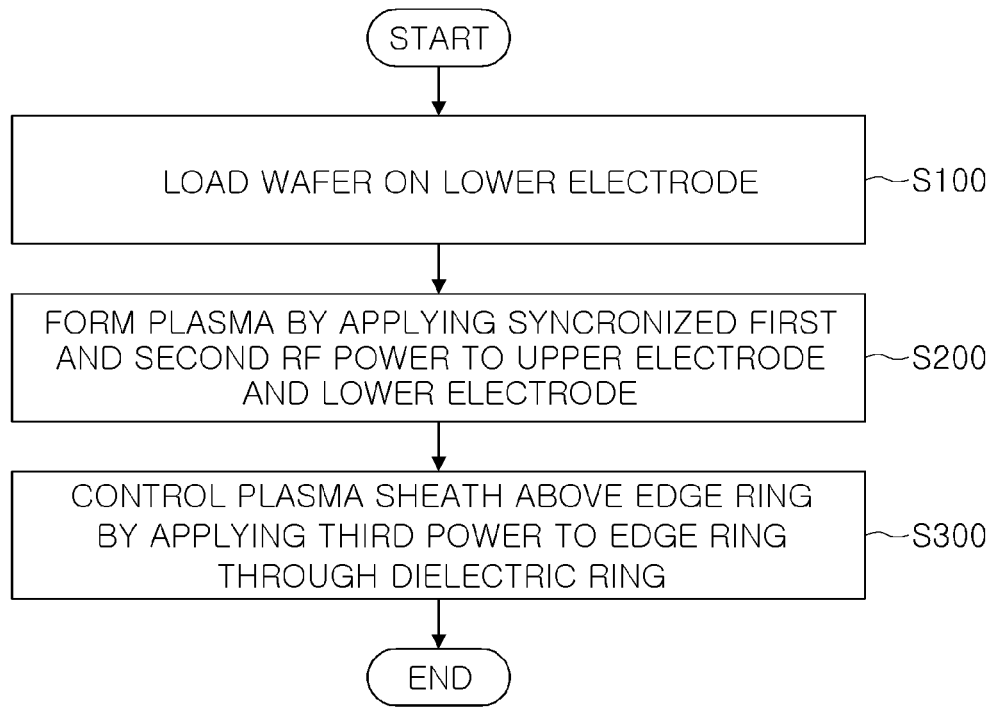
FIG. 14 is a schematic flowchart of a method of manufacturing a semiconductor device according to an example embodiment of the present inventive concept.

A method of manufacturing a semiconductor device using the plasma processing apparatus 1 described above will be described with reference to FIGS. 1 and 14. Since the same reference numerals as in the above-described embodiment have the same configuration, detailed description thereof will be omitted.

A wafer W may be loaded on a lower electrode 10 disposed in a processing chamber 90 of a plasma processing apparatus 1 (S100).

Next, first and second RF power supplies may be applied to an upper electrode 100 and a lower electrode 10 of the plasma processing apparatus 1, respectively. The first and second RF power supplies may be synchronized with each other, and plasma P may be formed by applying a high voltage to source gas supplied into the processing chamber 90. In this case, a plasma sheath in which ionization hardly occurs may be formed around the plasma P (S200).

Next, a third RF power supply may be applied to an edge ring 20 through a dielectric ring 50 to form an electric field above the edge ring 20, and a potential distribution of the plasma sheath may be controlled by adjusting a voltage of the third RF power supply (S300). The third RF power supply may apply a low frequency RF voltage such as 400 KHz and 2 MHz to 13.56 MHz, which are lower frequencies than each of the first and second RF power supplies. An electrode ring 30 disposed between the dielectric ring 50 and the edge ring 20 is formed of a material having a resistivity value of 90 Ωcm to 1000 Ωcm, so that a current applied through the edge ring 20 can be reduced. As a flow of current applied through the edge ring 20 decreases, a voltage of the plasma sheath that is changed per unit power increases, and a control range of the plasma sheath may be expanded. In addition, as the power consumed by the plasma sheath decreases, perturbation of the plasma P in a region, other than the upper portion of the edge ring 20 may be reduced.

Figure 11:
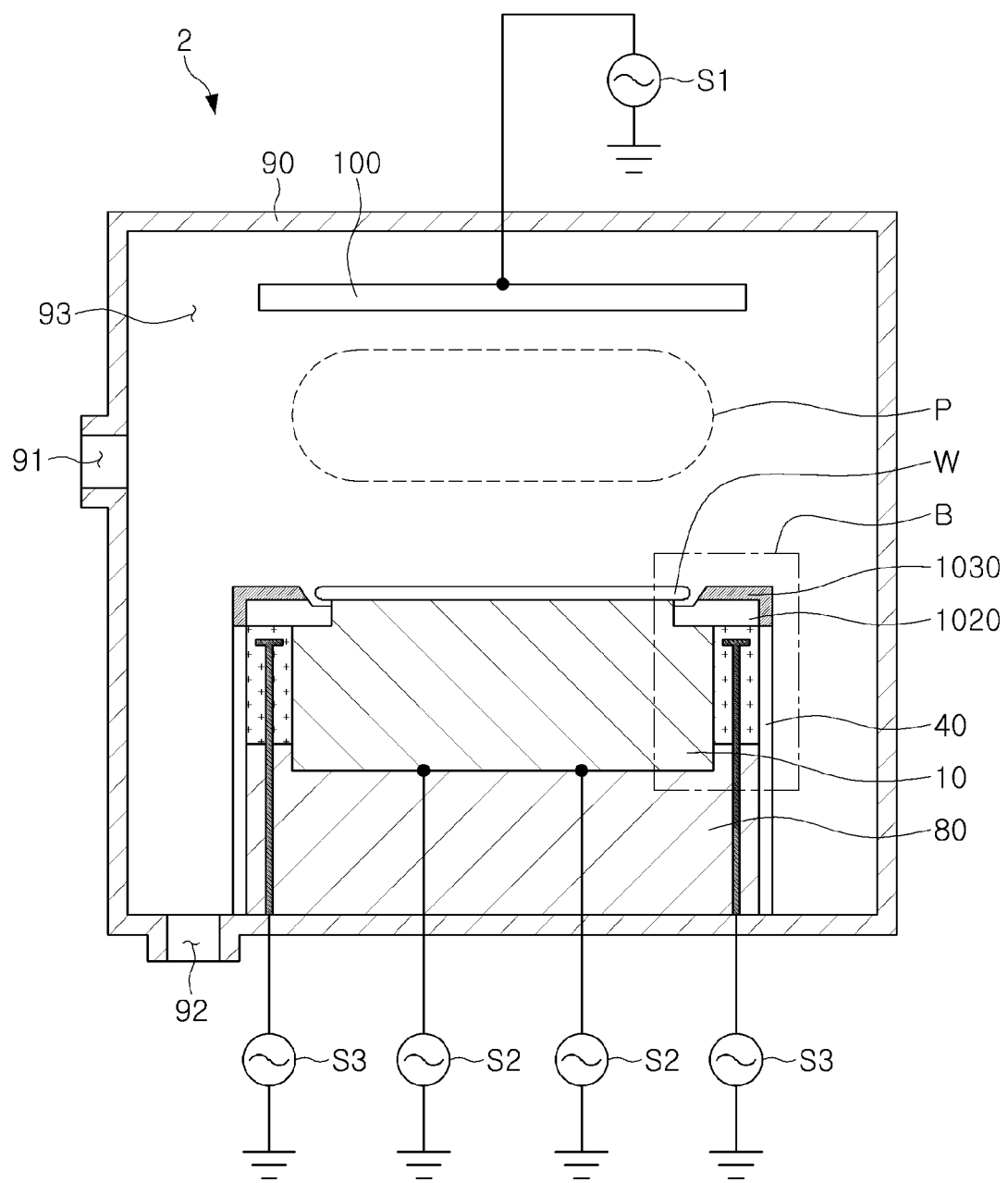
FIG. 11 is a view schematically illustrating a plasma processing apparatus according to an example embodiment of the present inventive concept.

A plasma processing apparatus according to example embodiments will be described with reference to FIGS. 11 and 12. FIG. 11 is a schematic diagram of a plasma processing apparatus according to an example embodiment of the present inventive concept, and FIG. 12 is an enlarged view of area "B" of FIG. 11 according to example embodiments.

A plasma processing apparatus 2 according to an example embodiment has a difference in that an edge ring cover 1030 is disposed on an edge ring 1020, as compared to the plasma processing apparatus 1 of the above-described example embodiment. Since the same reference numerals as in the above-described example embodiment have the same configuration, detailed descriptions thereof will be omitted.

Figure 12:
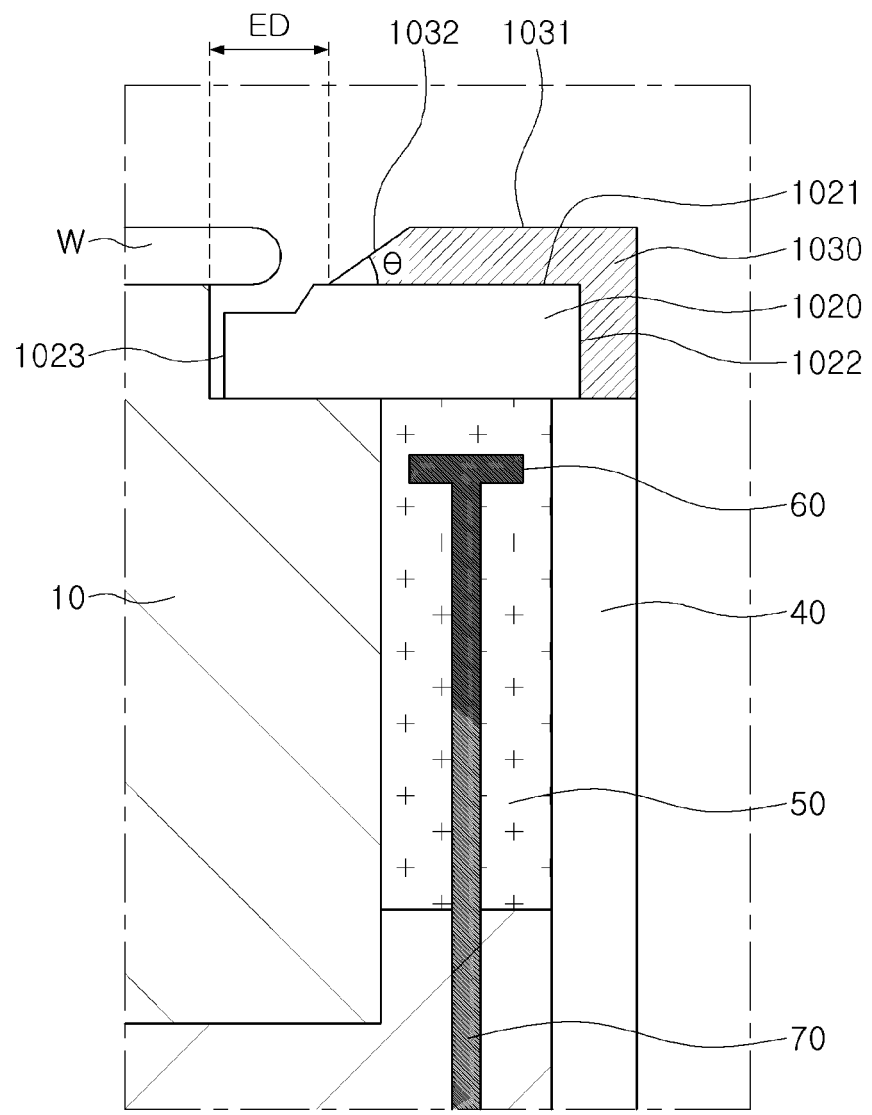
FIG. 12 is an enlarged view of area "B" of FIG. 11 according to example embodiments.

Referring to FIG. 12, the edge ring cover 1030 may be disposed above the edge ring 1020 according to an example embodiment. The edge ring cover 1030 may be formed to cover an upper surface 1021 and an outer peripheral surface 1022 of the edge ring 1020. In some examples, the edge ring cover 1030 may entirely cover the edge ring 1020 so that perturbation of plasma P by the edge ring 1020 is minimized. In some examples, since a region ED of the edge ring 1020, adjacent to the wafer W is relatively less affected by the plasma P due to the wafer W disposed thereabove, the edge ring cover 1030 may not be disposed in the region ED. For example, the region ED may have a width of about 6 mm from an inner circumferential surface 1023 of the edge ring 1020. An upper surface of the edge ring cover 1030 may have a flat surface 1031 and an inclined surface 1032. The inclined surface 1032 may be formed to have an inclination angle θ of 20° to 60°.

The edge ring cover 1030 may be formed of a dielectric material. For example, the edge ring cover 1030 may be formed of a material including at least one of quartz, $Al_2O_3$, and $Y_2O_3$.

Figure 13:
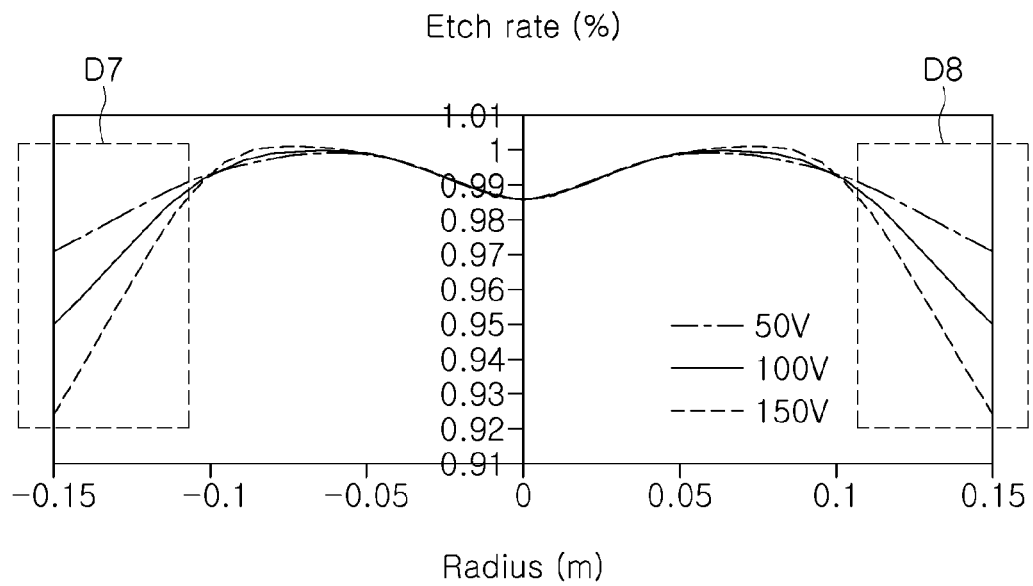
FIG. 13 is a graph illustrating an effect of mitigating etching rate variations of the edge ring cover of FIG. 11 according to example embodiments.

The edge ring cover 1030 having such a configuration has an effect of reducing the etching rate fluctuation of the plasma processing apparatus 2. This will be described with reference to FIG. 13. FIG. 13 is a graph that simulates etching rate variations when the edge ring cover 1030 is disposed on the edge ring 1020, which shows an etching rate for a voltage applied to the edge ring 1020. As the voltage applied to the edge ring 1020 changes to 50V, 100V, and 150V, it can be seen that an etching rate in edge regions D7 and D8 of the wafer W is decreased, but an etching rate in other regions is almost unchanged. Accordingly, it can be seen that the edge ring cover 1030 according to an example embodiment has an effect of mitigating the etching rate fluctuation of the plasma processing apparatus 2.

As set forth above, according to example embodiments of the present inventive concept, in a plasma processing apparatus, an electrode ring having a large resistivity value is disposed below an edge ring, so that a control range of a plasma sheath formed above the edge ring is expanded, and in a process of controlling the plasma sheath through the edge ring, perturbation of the plasma may be minimized.

In a method of manufacturing a semiconductor device according to example embodiments of the present inventive concept, the control range of the plasma sheath in a processing chamber is expanded, and perturbation of the plasma may be minimized in the process of controlling the plasma sheath.

While example embodiments have been shown and described above, it will be apparent to those skilled in the art that modifications and variations could be formed without departing from the scope of the present disclosure, as defined by the appended claims.

What is claimed is:

1. A plasma processing apparatus, comprising:
an electrostatic chuck supporting a wafer, and connected to a first power supply;
an edge ring disposed to surround an edge of the electrostatic chuck and formed of a material having a first resistivity value;
a first ring supporting a lower portion of the edge ring, formed of a material having a second resistivity value lower than the first resistivity value, and connected to a second power supply;
an electrode ring disposed in a region overlapping the first ring, in contact with a lower surface of the edge ring, and formed of a semiconductor material having a third resistivity value greater than the first resistivity value;
a first pad only attached to the lower surface of the edge ring and a bottom surface of a stepped portion disposed at an edge of the electrostatic chuck; and
a second pad only attached to a lower surface of the electrode ring and an upper surface of the first ring,
the first ring is surrounding an outer peripheral surface below the stepped portion,
wherein the first resistivity value is a value of 1 S/cm to 10 Ωcm,
wherein the third resistivity value is a value of 90 S/cm to 1000 Ωcm,
wherein a radio frequency (RF) power from the second power supply is applied to the edge ring through the first ring to form an electric field above the edge ring,
wherein each of the first and second pads includes an adhesive material, and
wherein a width of the first ring is the same as a width of the electrode ring.

2. The plasma processing apparatus of claim 1, wherein the edge ring has a thickness of 4 mm to 30 mm, and
wherein the electrode ring has a thickness of 2 mm to 30 mm.

3. The plasma processing apparatus of claim 1, wherein the electrode ring has a resistivity value gradually increasing toward an upper region of the electrode ring.

4. The plasma processing apparatus of claim 3, wherein the electrode ring comprises a plurality of layers stacked and formed of the same material with each other, and
wherein the plurality of layers has a dopant concentration decreasing toward the upper region of the electrode ring.

5. The plasma processing apparatus of claim 3, wherein the electrode ring comprises a plurality of layers formed of different materials, and
wherein the plurality of layers has resistivity increasing toward the upper region of the electrode ring.

6. The plasma processing apparatus of claim 1, further comprising a ground ring disposed to surround an edge of the first ring,
wherein the electrode ring does not overlap the ground ring.

7. The plasma processing apparatus of claim 1, wherein the first power supply supplies RF power of a higher frequency than the second power supply.

8. The plasma processing apparatus of claim 7, wherein the second power supply supplies 400 kHz of RF power.

9. The plasma processing apparatus of claim 1, further comprising:
an electrode pad embedded in the first ring; and
an electrode pin penetrating through the first ring and connected to the electrode pad at a top level of the electrode pin,
wherein the second power supply is connected to the electrode pin.

10. The plasma processing apparatus of claim 1, wherein the electrode ring comprises at least one of silicon (Si) and silicon carbide (SiC).

11. The plasma processing apparatus of claim 1, wherein the edge ring has a groove disposed in a portion on the lower surface thereof, and
wherein the electrode ring is disposed in the groove.

12. The plasma processing apparatus of claim 1,
wherein the upper surface of the first ring extends from the bottom surface of the stepped portion.

13. The plasma processing apparatus of claim 12, wherein the edge ring is disposed to overlap the bottom surface of the stepped portion and the upper surface of the first ring.

14. A plasma processing apparatus, comprising:
a processing chamber;
an upper electrode disposed in an upper region of the processing chamber and connected to a first power supply;
a lower electrode disposed below the upper electrode, supporting a wafer, and connected to a second power supply;
an edge ring disposed to surround an edge of the lower electrode and formed of a first semiconductor material having a first resistivity value;
a first ring supporting a lower portion of the edge ring, formed of a material having a second resistivity value lower than the first resistivity value, and connected to a third power supply;
an electrode ring disposed in a region overlapping the first ring, in contact with a lower surface of the edge ring, and formed of a second semiconductor material having a third resistivity value greater than the first resistivity value;
a first pad only attached to the lower surface of the edge ring and a bottom surface of a stepped portion disposed at an edge of the lower electrode; and
a second pad only attached to a lower surface of the electrode ring and an upper surface of the first ring,
the first ring is surrounding an outer peripheral surface below the stepped portion,
wherein a radio frequency (RF) power from the third power supply is applied to the edge ring through the first ring to form an electric field above the edge ring,
wherein the first resistivity value is a value of 1 S/cm to 10 Ωcm,
wherein the third resistivity value is a value of 90 S/cm to 1000 Ωcm,
wherein each of the first and second pads includes an adhesive material, and
wherein a width of the first ring is the same as a width of the electrode ring.

15. The plasma processing apparatus of claim 14, wherein the edge ring has a first region overlapping the lower electrode, and a second region overlapping the first ring and other than the first region, and
wherein the electrode ring is disposed in the second region.

16. The plasma processing apparatus of claim 14, wherein the first semiconductor material is the same as the second semiconductor material, and
wherein the second semiconductor material has a lower dopant concentration than that of the first semiconductor material.

17. A plasma processing apparatus, comprising:
a processing chamber;
an upper electrode disposed in an upper region of the processing chamber and connected to a first power supply;
a lower electrode disposed below the upper electrode, supporting a wafer, and connected to a second power supply;
an edge ring disposed to surround an edge of the lower electrode and formed of a first semiconductor material having a first resistivity value;
a first ring supporting a lower portion of the edge ring, formed of a material having a second resistivity value lower than the first resistivity value, and connected to a third power supply;
an electrode ring disposed in a region overlapping the first ring, in contact with a lower surface of the edge ring, and formed of a second semiconductor material having a third resistivity value greater than the first resistivity value;
a first pad only attached to the lower surface of the edge ring and a bottom surface of a stepped portion disposed at an edge of the lower electrode; and
a second pad only attached to a lower surface of the electrode ring and an upper surface of the first ring,
the first ring is surrounding an outer peripheral surface below the stepped portion,
wherein the electrode ring has a resistivity value gradually increasing toward an upper region of the electrode ring,
wherein each of the first and second pads includes an adhesive material, and
wherein a width of the first ring is the same as a width of the electrode ring.

18. The plasma processing apparatus of claim 17, wherein the edge ring has a first region overlapping the lower electrode, and a second region overlapping the first ring and other than the first region, and
wherein the electrode ring is disposed in the second region.

* * * * *